United States Patent [19]

Jansen et al.

[11] Patent Number: 4,616,186

[45] Date of Patent: Oct. 7, 1986

[54] FM QUADRATURE DEMODULATOR WITH DISTORTION COMPENSATION

[75] Inventors: Winfrid B. Jansen, Ellerbek; Wilfried E. Knop, Appen; Hermann Jabs, Hamburg, all of Fed. Rep. of Germany

[73] Assignee: U.S. Philips Corporation, New York, N.Y.

[21] Appl. No.: 738,128

[22] Filed: May 24, 1985

[30] Foreign Application Priority Data

May 25, 1984 [DE] Fed. Rep. of Germany ....... 3419602

[51] Int. Cl.$^4$ ............................................. H03D 3/00
[52] U.S. Cl. .................................... 329/103; 329/137
[58] Field of Search ............... 329/103, 110, 131, 134, 329/137, 140, 145; 375/80, 102; 455/214, 295, 304, 305, 312

[56] References Cited

U.S. PATENT DOCUMENTS 3,204,190  8/1965  Broadhead, Jr. ............... 455/312 X
4,152,665  5/1979  Cunningham ................... 330/267 X
4,342,000  7/1982  Ogita ............................. 455/214 X

FOREIGN PATENT DOCUMENTS 0129228  11/1945  Australia ......................... 329/131

*Primary Examiner*—Eugene R. LaRoche
*Assistant Examiner*—D. C. Mis
*Attorney, Agent, or Firm*—Thomas A. Briody; William J. Streeter; Leroy Eason

[57] ABSTRACT

A circuit for reducing the distortion in an FM quadrature demodulator. A non-linear circuit stage is connected after the quadrature demodulator, whose characteristic has an inverse curve form like the demodulator characteristic. If the FM quadrature demodulator uses a resonant circuit to generate a frequency-dependent phase shift and has two outputs in phase opposition, the non-linear circuit stage can be formed by two diode branches through which the output currents of the quadrature demodulator flow. The voltage difference at these two diode branches supplies the output signal with the non-linear distortions largely removed.

6 Claims, 5 Drawing Figures

FIG.3

FM QUADRATURE DEMODULATOR WITH DISTORTION COMPENSATION

The invention relates to a circuit for reducing the distortion in an FM quadrature demodulator in which a frequency-dependent phase shift is fed between the signls to the two inputs of the FM quadrature demodulator. The phase shift is produced by means of a resonant circuit and the sum of the output currents of the FM quadrature demodulator is substantially constant.

Such a circuit for reducing the distortion in an FM quadrature demodulator is known from the publication "ADVANCED FM-IF" by Donal Wild issued by the National Semiconductor Corporation on the subject of the integrated circuit LM 1865. The FM quadrature demodulator contains a multiplier stage to which the two input signals are fed with a frequency-dependent phase shift and the direct current of which is increased slightly by means of a d.c. feedback as a function of the deviation from the center frequency.

The object of the present invention is to create an improved, easy-to-implement circuit for reducing the distortion in an FM quadrature demodulator.

SUMMARY OF THE INVENTION

The invention achieves this object as follows. The output signal of the FM demodulator (5 . . . 8) is fed to a linear amplifier (11) via a circuit whose output signal amplitude ($\Delta U$) as a function of the input signal amplitude ($\Delta I$) is substantially the inverse curve of the amplitude of the output signal ($\Delta I$) of the FM quadrature demodulator as a function of the frequency deviation ($\Delta f$) of the demodulated input signal from a nominal value. The output currents ($\Delta I$) of the FM quadrature demodulator (5 . . . 8) are each fed to a diode branch (9, 10) of the circuit and the input signal of the linear amplifier (11) is derived from the differential voltage ($\Delta U$) at the two diode elements (9, 10).

The distortion which the demondulated input signal experiences during the demodulation in the FM quadrature demodulator is compensated in the invention by an inverse distortion. As a result, the amplitude of the output signal of the non-linear circuit varies linearly as a function of the frequency deviation of the input signal being demodulated from a nominal valve. The subsequently connected linear amplifier provides further linear amplification of this output signal.

The circuit described in the pior-art publication already mentioned has an amplifier connected to an FM demodulator via a non-linear circuit, but in this arrangement the amplifier is fundamentally non-linear and the non-linear circuit is used to linearise this non-linear amplifier. The characteristic which the non-linear circuit must have in order to be able to compensate the distortions caused by the quadrature demodulator depends on the phase response of the phase shifter by means of which the input signal being demodulated is phase-shifted as a function of frequency. In principle, this may be any non-linear analog-digital converter (or digital-analog converter). This solution, however, is relatively expensive, more especially as a linear digital-analog converter (or analog-digital converter) is usually required.

It should be mentioned at this point that it is known from U.S. Pat. No. 4,152,665 that the distortion caused by a non-linear amplifier can be compensated by a subsequently connected push-pull stage having diodes with a characteristic which is the inverse of the characteristic of the preceding amplifier.

In an FM-quadrature demodulator, a frequency-dependent phase shift is normally produced between the signals fed to the two inputs of the FM quadrature demodulator by means of a resonant circuit, and the sum of the two output currents of the quadrature demodulator is substantially constant. In accordance with a preferred embodiment of the invention the distortions in such an FM quadrature demodulator can be reduced by feeding each of the output currents of the FM quadrature demodulator to a diode branch and deriving the output signal of the circuit from the differential voltage at the two diode elements.

DESCRIPTION OF THE FIGURES

The invention will be explained below in greater detail with the aid of the drawing which show FIG. 1 the block circuit diagram of an FM receiver according to the invention, FIG. 2a the characteristic of the quadrature demodulator, FIG. 2b the characteristic of the non-linear circuit for compensation of the distortions, FIG. 3 a preferred embodiment of the invention and FIG. 4 the curve form of the distortion factor with and without compensation of the distortions.

DESCRIPTION OF THE PREFERRED EMBODIMENT

Figure 1:
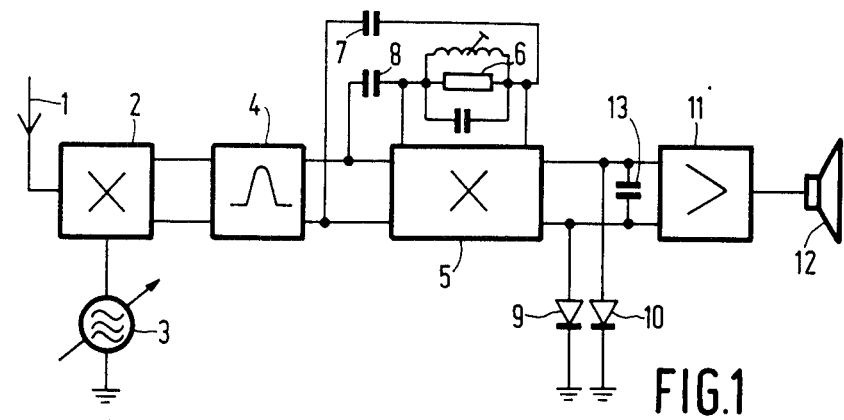

According to FIG. 1, the signal supplied from an antenna 1 is fed to a high-frequency mixer stage 2 in which it is converted into an intermediate frequency of, for example, 10.7 MHz by means of a tunable oscillator 3. The output signal of the mixer stage 2 is amplified in an intermidate-frequency amplifier 4 and fed to an FM quadrature demodulator, preferably via a limiting amplifier (not illustrated). The FM quadrature demodulator contains a multiplier stage 5, which at its high-impedance output generates a push-pull signal (i.e. the sum of the output currents is constant) which is proportional to the product of the voltages at the inputs of multiplier stage 5, and a phase shifted input signal. A phase shifter generates a frequency-dependent phase shift between the voltages fed to the two inputs of multiplier stage 5. The phase shifter comprises a parallel resonant circuit 6 with a Q factor Q=20, the terminals of which are connected to the outputs of the IF amplifier 4 via two capacitors 7 and 8. The capacitance of capacitors and 8 approximately 15 times less than the capacitance of the capacitor contained in the parallel resonant circuit. The voltage in the parallel resonant circuit 6 is multiplied in multiplier stage 5 by the voltage at the output of IF amplifier 4. The parallel resonant circuit is balanced in such a way that a minimum distortion factor of the second order occurs at the intermediate frequency (10.7 MHz). Such an FM quadrature demodulator is known from the VALVO Datenbuch 1983 "Integrated anglog circuits for radio and AF applications" page 340.

The two push-pull output terminals of the FM demodulator are connected via two foreward-biased diodes 9 and 10 to earth and to the input terminals of a linear amplifier. The output of the linear amplifier is connected to a loudspeaker. Between the input terminals is connected a capacitor 13 which short-circuits the demodulation products having twice the frequency of the intermediate frequency. The currents delivered by multiplier stage 5, which comprise a direct and a smaller AF (Audio Frequency) component, flow completely through diodes 9 and 10, because the input impedance of linear amplifier 11 is high. These diodes produce a differential voltage which is amplified by amplifier 11 comprising various linear stages and then fed to loudspeaker 12.

Figure 2A:
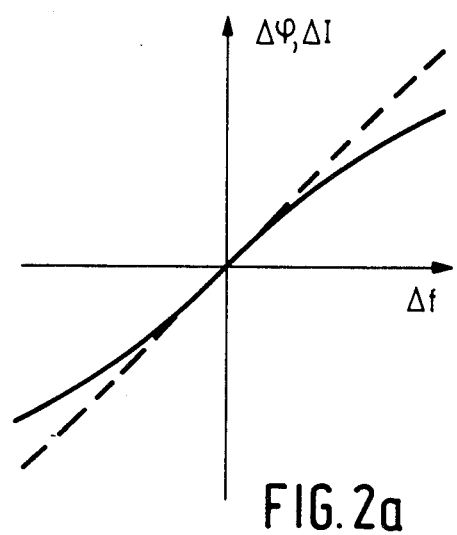

The operation of the invention can be explained by reference to FIGS. 2a and 2b. FIG. 2a represents the demodulator characteristic, i.e. it shows the dependence of the phase shift $\Delta\phi$ produced by the phase shifter and of the output current difference $\Delta I$ on the deviation $\Delta f$ of the frequency of the demodulated signal from the center value (10.7 MHz). To make things clearer, dashed lines are used to show the characteristic which the quadrature demodulator should have it it were operating distortion-free. It can be seen that with greater frequency increments the amount of the slpe decreases.

Direct currents which differ by $\Delta I$ are fed to diodes 9 and 10. This produces in the diodes a differential voltage $\Delta U$, whose dependence on the output current of the FM demodulator $\Delta I$ is shown in FIG. 2b. It can be seen that with larger output current differences the amount of the slope increases. The characteristic shown in FIG. 2b is therefore the inverse of the characteristic in FIG. 2a so that the voltage difference $\Delta U$ at the input of the linear amplifier 11 is proportional to the deviation $\Delta f$ from the center frequency. The distortion produced by the FM quadrature demodulator 5 . . . 8 are compensated therefore by the oppositely directed distortion of the output signal at diodes 9, 10.

The extent to which the compensation is achieved is determined by the quality of the parallel resonant circuit 6, the efficiency of the multiplier stage and by the diode characteristics. Generally these parameters do not have the values to provide the best possible compensation.

Figure 2B:
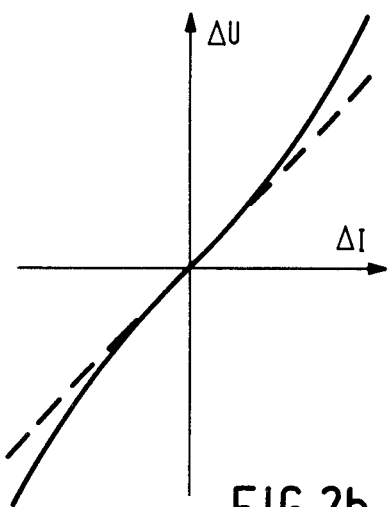

It is necessary therefore to adapt the characteristic in FIG. 2b to meet the requirements of the characteriistic in FIG. 2a. For instance, a reduction in the non-linearity of the diodes can be brought about by feeding an additional direct current of a certain magnitude to each of the two diode branches. The distortion is, in fact, so much the smaller, the smaller the current different $\Delta I$ compared to the direct current through these diodes. Instead of this, it is also possible to connect a resistor in series with each of the diodes and to utilise the difference of the voltages in the series circuits of resistor and diode. This solution has the advantage that the d.c. voltage drop in the series circuit is greater than the d.c. voltage drop in one diode alone, and this facilitates the further processing by linear amplifier 11.

On the other hand, the non-linearity may be increased by lowering the invariable d.c. component through the diodes, e.g. by connecting a resistor or a suitable biased d.c. source in parallel with the diodes. In this case the ratio between the signal-dependent current component $\Delta I$ and the constant direct current through the two diodes is increased, resulting in more marked non-linearity.

Figure 3:
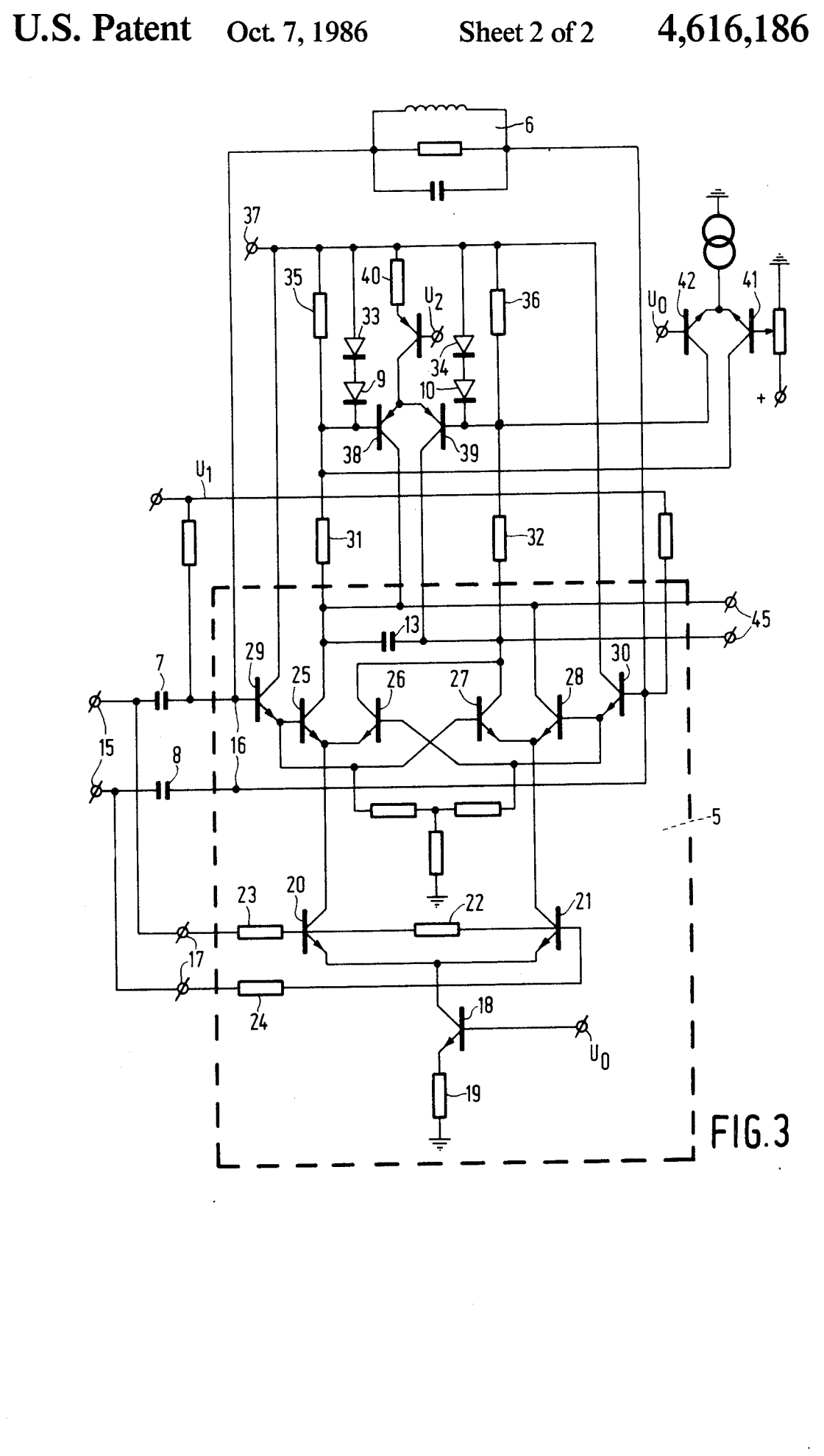

FIG. 3 presents the detailed circuit diagram of an embodiment which can be connected between the output of the intermediate amplifier 4 and the input of the linear amplifier 11 in place of the components 5 . . . 10 and 13. The input terminals 15 of the circuit, connected to the output of the IF amplifier 4, are connected directly to the first input 17 of multiplier stage 5 and via capacitors 7 and 8 to the second input 16 of multiplier stage 5, to which the parallel circuit 6 with a Q-factor of approximately 20 is connected in parallel. The multiplier stage contains a d.c. source in the form of an npn-transistor 18, of which the emitter is connected to earth via a resistor 19, the base is connected to a constant d.c. voltage $U_o$ and the collector is connected to the emitters of two further npn-transistors 20 and 21. The bases of transistors 20 and 21 are connected via equal-valued resistors 23 and 24 to the terminals of the first input 17. Between the bases is connected a resistor 22 which ensures that the alternating component of the signal between the bases of transistors 21 and 22 is always only a fraction of the input signal at the terminals 17. The collector of transistor 20 is connected to the emitters of two transistors 25 and 26, while the collector of transistor 21 is connected to the emitters of two transistors 27 and 28. Transistors 25 to 28 are also of the npn-type. The base electrodes of transistors 25 and 27 which are connected to one another are connected to the output of an emitter follower 30.

The interconnected collectors of transistors 26 and 27, and 25 and 28, form the output 45 of multiplier stage 5 connected to the input of the high-impedance linear amplifier 11. The series circuit of two forward-biased diodes 9 or 33 and 10 or 34 is also connected to these outputs via a resistor 31 or 32 respectively in each case. The other terminal of this series circuit is ocnnected each time to a positive supply voltage terminal 37. Furthermore, resistors 35 and 36 are connected in parallel with each of the two series circuits.

The voltage difference between the two aforementioned series circuits is connected to the bases of two pnp-transistors, into the common emitter lead which is connected a d.c. source 40. The collector of transistor 38 is connected to the same output terminal of multiplier stage 5 to which its base is also connected via resistor 31. The collector of transistor 39 is connected to the (other) output terminal of the multiplier stage to which its base is connected via resistor 32.

There are two reasons why the circuit has two diodes 9 and 33 or 10 and 34 respectively in each case instead of one diode 9 or 10.

On the one hand, they produce the bias voltages for transistor 38 or 39 and the transistor forming the power source 40 and, on the other, the second diode (e.g. 33 or 34 respectively) eliminates precisely those non-linear distortions which would otherwise be caused by the non-linear relationship between the base-emitter voltage of transistors 38, 39 and their collector current.

The network formed from components 9, 10 and 31 . . . 40 is a non-linear two-pole network the differential resistance of which increases, as shown by FIG. 2B with increasing signal level so that the distortions caused by the FM quadrature demodulator 5 . . . 9 are largely compensated.

With an increase in the circuit quality the distortion of the FM quadrature demodulator would increase; in this case, too, a distortion minimum would also be acieved by replacing resistors 35, 36 and/or resistors 31 and 32 by lower resistance values. Instead of this, the current of power source 40 could also be increased. With a reduction in the circuit quality, resistors 31, 32 and/or 35, 36 would have to be increased or the current through power source 40 would have to be reduced.

If an additional phase shift were introduced by the multiplier stage 5, this would have the result that at the center frequency ($\Delta f=0$) there would be a phase difference distinct from zero or a current difference distinct from zero. This offset can be eliminated by means of a circuit which contains two npn-transistors 41 and 42, of which the emitters are connected to earth by way of a power source and the collectors are each connected to one of the diode branches 9 and 33 or 10 and 34. The base of one transistor, e.g. 42, is connected to a fixed d.c. voltage and the base of transistor 41 is connected to the wiper of a d.c. voltage connected potentiometer. By varying the position of the potentiometer wiper it is possible to alter the ratio of the direct currents fed to diode branches 9, 33 or 10, 34 in such a way that at the center frequency the output voltage ΔU becomes exactly zero.

Figure 4:
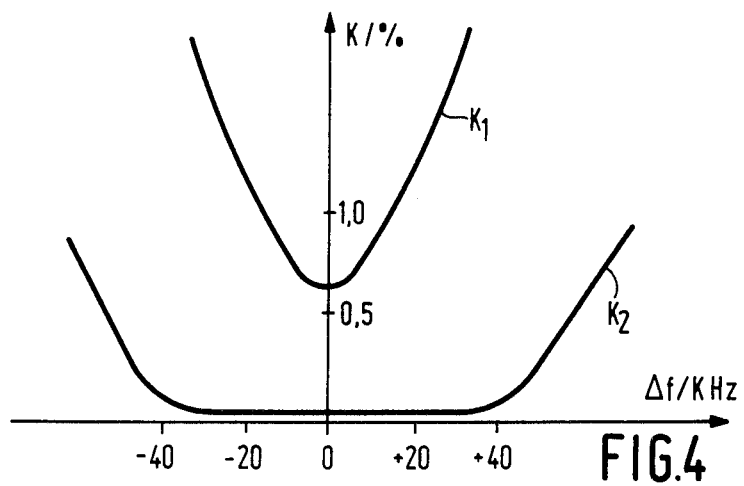

The performance of the invention is illustrated, in the diagram of FIG. 4. In this diagram, $K_1$ represents the curve of the distortion factor as a function of the frequency increment Δf which would occur in the case of a frequency deviation of 75 kHz and an audio-frequency signal of 1 kHz if a linear resistance network were connected to the output of the multiplier stage. It can be seen that even with exact turning the distortion factor is still greater than 0.5% (for a Q-factor of 20). The larger the frequency increment, i.e. the greater the difference between the IF center frequency and the difference from transmitter and oscillator frequency, the more the distortion factor will increase.

Curve $K_2$ shows the behavior of the distortion factor for the cicuirt in FIG. 3. It can be seen that up to a frequency increment of +40 kHz the distortion factor (for a Q-factor of 20, a frequency deviation of 75 kHz and an audio-frequency of 1 kHz) still remains below 0.1%.

Thus, there is descirbed one embodiment of the invention for improving the overall performance of an FM quadrature demodulator by reducing distortion. Those skilled in the art will recognize yet other embodiments of the invention defined more particularly by the claims which follow.

What is claimed is:

1. In an FM quadrature demodulation apparatus having a pair of input terminals connected to a resonant network for producing a reference phase shift signal having a phase shift proportional to the frequency of a received intermediate frequency signal, and a pair of push-pull output terminals producing differential signals feeding a linear amplifier; a circuit for reducing distortion of said differential signals comprising:
    a first and second diode branch connected from said output terminals to a common signal connection for said demodulation apparatus, whereby a circuit is formed having a frequency transfer function substantially the inverse of the transfer function of said quadrature demodulation apparatus.

2. A circuit as claimed in claim 1, in which each diode branch has a diode whose current depends exponentially on the applied voltage.

3. A circuit as claimed in claim 2, in which each diode is connected via a resistor to one of the outputs of the FM quadrature demodulator and the voltage difference at the output of the FM demodulator serves as the input signal of the linear amplifier.

4. A circuit as claimed in claim 2, in which a resistor is connected in parallel with each of the diodes.

5. A circuit as claimed in claim 2, further comprising:
    a second diode connected in series with each of said diodes of said first and second diode branches;
    first and second transistors having commonly connected emitters, collectors connected to each of said differential output terminals of said quadrature demodulation circuit, and base connections connected to said first and second diode branches; and
    a current source feeding said commonly connected emitters, whereby said transistors' collectors produce differential output voltages.

6. A circuit as claim in claim 5 further comprising an auxiliary current source connected to supply a variable current to said transistors for controlling said collector's differential output voltage to proudce a predetermined voltage level for a specific received signal frequency.

* * * * *